United States Patent [19]

Fukunaga et al.

[11] Patent Number: 5,145,532
[45] Date of Patent: Sep. 8, 1992

[54] SOLDER PRECIPITATING COMPOSITION

[75] Inventors: Takao Fukunaga; Hisao Nakajima, both of Hiratsuka; Kenzo Kobayashi, Ichihara; Masanao Kono, Kakogawa; Hisao Irie, Takasago; Ryo Inoue, Himeji, all of Japan

[73] Assignees: The Furukawa Electric Co., Ltd., Tokyo; Harima Chemicals, Inc., Kakogawa, both of Japan

[21] Appl. No.: 244,791

[22] Filed: Sep. 14, 1988

[30] Foreign Application Priority Data

Sep. 14, 1987 [JP] Japan .................................. 62-228298
Jun. 27, 1988 [JP] Japan .................................. 63-156688

[51] Int. Cl.$^5$ ............................................ B23K 35/24
[52] U.S. Cl. ........................................ 148/23; 148/24; 148/26; 252/518; 252/511
[58] Field of Search ..................... 252/518, 510, 511; 148/23-26

[56] References Cited

U.S. PATENT DOCUMENTS

| | | | |
|---|---|---|---|
| 3,978,378 | 8/1976 | Tigner et al. ....................... | 317/258 |
| 4,490,378 | 12/1984 | Kleiner ................................ | 252/512 |
| 4,661,173 | 4/1987 | Barajas et al. . | |
| 4,851,153 | 7/1989 | Kono et al. ........................ | 252/518 |

FOREIGN PATENT DOCUMENTS

| | | |
|---|---|---|
| 1508343 | 10/1969 | Fed. Rep. of Germany . |
| 3010610A1 | 10/1981 | Fed. Rep. of Germany . |
| 62-227593 | 10/1987 | Japan . |
| 63-114979 | 5/1988 | Japan . |
| PCT/EP86/-00146 | 3/1986 | PCT Int'l Appl. . |
| 2096036A | 10/1982 | United Kingdom . |

Primary Examiner—Karl Group
Attorney, Agent, or Firm—Frishauf, Holtz, Goodman & Woodward

[57] ABSTRACT

A solder precipitating composition comprises a powder of a metal having the highest ionization level among metals constituting a solder alloy to be prepared, and a salt between a carboxylic acid and a remaining metal of the solder alloy. The composition is applied to a surface on which the solder is to be precipitated, and the solder is precipitated, thereby performing soldering.

28 Claims, 1 Drawing Sheet

SOLDER PRECIPITATING COMPOSITION

BACKGROUND OF THE INVENTION

1. Field of the Invention

The present invention relates to a solder precipitating composition suitable for soldering electronic components and a method of precipitating a solder by using the same.

2. Description of the Related Art

A surface mounting technology for electronic components has been widely employed in order to manufacture light, thin, and compact electronic devices. According to this technology, a solder cream is applied to a pad of a printed circuit board, and each electronic component is placed thereon. The circuit board with the electronic components is placed in a reflow furnace to melt the solder cream, thereby soldering the leads of the electronic components to the pads of the printed circuit board.

A solder cream used in this technology is prepared by dispersing a solder alloy powder and a flux in a high-boiling point solvent such as a mineral spirit to impart a predetermined viscosity to the solder cream.

A method using the solder cream can be applied to a wiring pattern having a lead pitch of about 0.65 mm. However, this method cannot be applied to smaller wiring patterns because of the fact that bridges (i.e., conduction between the pads through the solder) tend to be formed. This method cannot cope with the trend of a higher integration density of electronic circuits.

In order to solve the above problem, an organic solder is proposed wherein tin or lead is bonded to a maleic or fumaric adduct of rosin, and a metal component is eliminated upon heating to precipitate a solder (Japanese Patent Application No. 61-72044). However, in order to increase the metal content, this organic solder is prepared such that rosin is converted into a maleic or fumaric adduct to introduce a carboxylic acid, and tin or lead is introduced into the carboxylic acid. Therefore, solubility of the resultant organic solder in organic solvents is poor. For this reason, it is difficult to control the viscosity of the organic solder and to apply it to a wiring micropattern.

SUMMARY OF THE INVENTION

The present invention was contrived in consideration of the above problems of the conventional techniques, and has as its object to provide a new solder precipitating composition suitable for soldering fine patterns or formation of a solder bump and a method of precipitating a solder by using the solder precipitating composition.

As described in Japanese Patent Application 62-120863 filed by one of the present applicants, when a metal salt of an organic acid such as rosinic acid is dissolved in a proper solvent (e.g., squalene), and a metal having a higher ionization level than that of a metal constituting the metal salt is immersed in the resultant solution, a metal constituting the metal salt can then be precipitated on the surface of the immersed metal.

The present invention utilizes a phenomenon for precipitating a metal due to the ionization level difference described above. More specifically, a metal powder having the highest ionization level of the metals constituting the solder alloy is mixed with a salt between the remaining metal or metals (i.e. any other metals of the solder alloy, having a lower ionization level than the metal powder) and a carboxylic acid. Alternatively, a metal powder which is not constituting the solder alloy is mixed with a salt between the metals constituting the solder alloy and a carboxylic acid. The resultant mixture is applied to a portion of a printed circuit board, which is subjected to soldering. The mixture is heated to a predetermined temperature (e.g. a temperature near a melting point of the solder), the solder alloy is precipitated, and soldering is performed. The mechanism of solder precipitation is not clarified, but may be assumed as follows. A metal salt of a carboxylic acid is decomposed to produce free metal ions, and these ions are transferred to the metal powder grains due to an ionization level difference therebetween and are precipitated as a metal on the surface of the metal grain due to a substitution reaction. At the same time, the precipitated metal grains are melted and mixed and precipitated as a solder alloy.

According to this method, when a composition of the present invention is applied to a pad array including a non-pad portion (e.g., a non-metal portion) on the printed circuit board and is heated, the solder is selectively precipitated on only the pad portion. This selective solder precipitation was successfully performed by a composition of the present invention in a micropattern of which had previously been subjected to the formation of bridges with the conventional solder cream. Namely, the solder precipitating composition of the present invention was found to have an excellent solderability for fine patterns.

The solder precipitating composition of the present invention has better solderability for fine patterns than that of the conventional solder cream because of the fact that a chemical reaction occurs on the metal powder surface upon heating and a very active surface state can be maintained in the composition of the present invention.. The advantage of the composition of the invention is also due to the fact that the metal powder content in the composition of the present invention can be smaller than that of the conventional solder cream, as will be described in examples of the present invention, and that the mobility of the metal grains can therefore be increased. In the conventional solder cream, the solder grains are considerably dense and are simply melted by heat. Therefore, the solder located in the non-pad portion is concentrated on the pad portion due to only a surface tension of the melted solder. When the distance between the pads is narrow, bridges tend to be formed therebetween.

DETAILED DESCRIPTION OF THE PREFERRED EMBODIMENT

Figure 1:
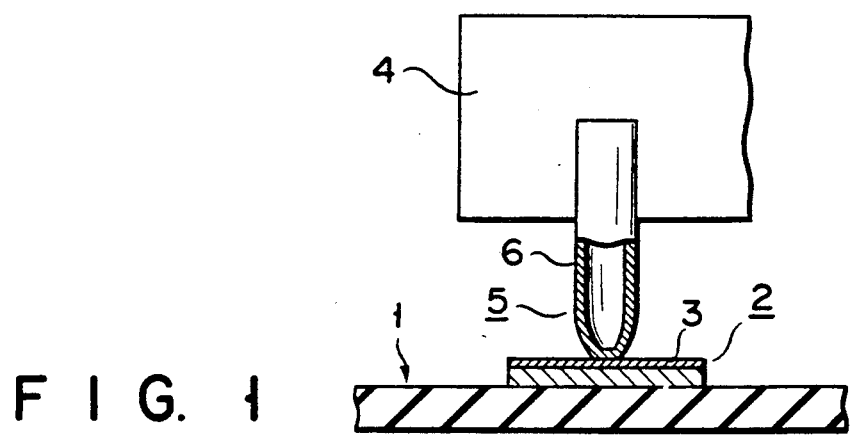
FIGS. 1 to 3 are sectional views explaining samples in which a method of precipitating a solder of the present invention is applied to the soldering of electronic components.

When a solder to be precipitated in the present invention is a tin-lead solder alloy, the metal which is to be substituted with hydrogen atoms of a carboxylic acid to form a salt is lead, and the metal powder consists of tin. If a solder to be precipitated is an indium-tin-lead solder alloy, the metals which are to be substituted with hydrogen atoms of the carboxylic acid to form a salt are tin and lead, and the metal powder consists of indium.

The salt obtained by substituting hydrogen atoms of the carboxylic acid with a metal having a lower ionization level in the solder alloy components may contain a salt of a metal having a higher ionization level in the solder alloy components. For example, a lead-containing salt of a carboxylic acid may be a tin-lead carboxylate containing both lead and tin. It should be noted that the tin carboxylate has almost no influence on precipitation of the solder.

The solder precipitating composition of the present invention can be formed into a paste as follows. A salt between a carboxylic acid and a metal having a lower ionization level and being included as one of the solder alloy components is dissolved in a solvent. Then, a powder of a metal having a higher ionization level and being included as one of the solder alloy components and a viscosity stabilizer are added to the resultant mixture. When a metal salt of a carboxylic acid is a liquid, a metal powder and a viscosity stabilizer are added to the liquid metal salt to prepare a paste. This paste-like solder precipitating composition can be used for screen printing or supplied to a soldering portion by a dispenser or the like in the same manner as with the conventional solder cream.

A ratio of the salt to the metal powder in the solder precipitating composition varies in accordance with the component ratios of solder alloys to be prepared. Since the free metal ions separated from the salt during precipitation of the solder, are subjected to a substitution reaction with metal atoms of the powder, the weights and atomic weights of the metal of the powder and the metal in the salt must be taken into consideration. A ratio of the salt to the metal powder in the solder precipitating composition according to the present invention is determined such that ratio of weight Wp of the powder of metal P to weight Ws of metal S contained in the salt is given by:

$$Wp/Ws = Ap/As + Mp/Ms \qquad (1)$$

where,

As: parts by weight of metal S of a solder alloy to be prepared,
Ap: parts by weight of metal P of the solder alloy to be prepared,
Ms: atomic weight of metal S
Mp: atomic weight of metal P If the equation (1) is given, the solder having a desired component ratio can be precipitated at the end of a reaction between the metal salt and the metal powder. For example, when a solder of a 62tin-38lead eutectic alloy is to be precipitated, the salt and the tin powder are mixed such that the ratio of the weight of the lead to the weight of the tin powder is given to be 10 : 22.

The present invention, however, is not limited to such a composition ratio. Even if ratio Wp/Ws is smaller than the above value of Ap/As+Mp/Ms (i.e., the amount of metal is smaller than the amount of metal P determined by the equation (1)), a desired solder composition can still be obtained by controlling the heating time. More specifically, while the amount of metal powder is made lower than the amount of metal P determined by the equation (1), and heating is interrupted when the substitution reaction progresses to some extent, thereby interrupting the reaction. Even if the amount of metal powder is small, the solder having a desired component ratio ca still be precipitated.

When a tin-lead solder is precipitated on, e.g., a tin-plated portion, the plated tin also contributes to the substitution reaction. Therefore, the amount of tin powder can be made lower than the amount of metal P in the desired ratio described above.

There are three methods of mixing a metal powder with a metal salt of a carboxylic acid. These methods will be explained taking the preparation of a tin-lead solder for example. According to the first method, while a lead carboxylate is being heated to its melting point or more a tin powder is mixed therewith. According to the second method, while a lead carboxylate is dissolved in an appropriate solvent, a tin powder is mixed therewith. According to the third method, a tin powder is mixed with a liquid lead carboxylate. A composition prepared by the first method must be applied to a metal surface on which a solder is to be precipitated, while the lead carboxylate is being heated to its melting point (e.g., 140° to 150° C. for a lead salt of rosinic acid). The viscosity of a composition prepared by the second or third methods can be adjusted by adding a viscosity stabilizer thereto. Therefore, this composition is applied to the metal surface on which the solder is to be precipitated in the same manner as with the conventional solder cream.

After the solder precipitating composition has been applied to the surface, when the composition is heated within 185° to 260° C., preferably 185° to 225° C., the tin-lead solder can then be precipitated on the metal surface.

A typical carboxylic acid constituting a salt with a metal according to the present invention is a mono- or di-carboxylic acid having 1 to 40 carbon atoms. Examples of such a carboxylic acid are: lower fatty acids (e.g., formic acid, acetic acid, and propionic acid); fatty acids obtained from animal or vegetable oil (e.g., caproic acid, caprylic acid, lauric acid, myristic acid, palmitic acid, stearic acid, oleic acid, and linoleic acid); various synthetic acids obtained from organic synthesis reactions (e.g., 2,2-dimethyl pentanoic acid, 2-ethyl hexanoic acid, isononanic acid, 2,2-dimethyloctanoic acid, and n-undecanoic acid); resin acids (e.g., pimaric acid, abietic acid, dehydroabietic acid, and dihydroabietic acid); dimer acids prepared by synthesizing a mono-carboxylic acid (e.g., naphthenic acid) obtained from petroleum and tall oil fatty acid or soy bean fatty acid; dicarboxylic acids (e.g., polymerized rhodin obtained from the conversion of rhodin into dimer); and a mixture of the two components thereof.

In the present invention, a solder can also be precipitated by combining the carboxylic acid salt of metals constituting the solder alloy, with a metal other than the metals constituting the solder alloy. For example, Zn and In are given as metals not included in the metals which constitute the solder alloy, and Sn and Pb are given as metals which constitute the solder alloy. In this case, for combination of these metals, Zn-Sn-Pb and In-Sn-Pb systems are possible. Since the ionization tendency of these metals are given as Zn>Sn>Pb and In>Sn>Pb, respectively, their reactions progress as given by the following formulas:

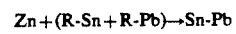

(where R-Sn and R-Pb are carboxylic acid salts of Sn and Pb, respectively).

When substitutions of Sn and Pb have been completed by In or Zn, an Sn-Pb alloy is precipitated at the locations where the compositions of these systems have been applied.

In this case, the solder can be precipitated at a desired position according to the method described above.

EXAMPLES

The present invention will be described in detail by way of its examples.

EXAMPLE 1

Lead salt of rosinic acid was heated within 140° to 150° C. and melted, and a tin powder was mixed with the melted lead salt (5 g of the tin powder with respect to 10 g of the lead salt of rosinic acid), thus preparing a solder precipitating composition. This molten composition was applied to a test substrate obtained by forming a tin-plated copper film pattern on an insulating substrate. After the composition had been cooled and solidified, it was then heated at 200° C. for 2 minutes, thereby precipitating a solder on the copper film pattern.

EXAMPLE 2

A composition (tin : lead = 6 : 4; 5 g of the tin powder with respect to 10 g of a tin-lead salt of rosinic acid) obtained by mixing a tin powder into a tin-lead salt of rosinic acid was melted and applied to a test substrate as in Example 1. After the composition had been cooled and solidified, it was then heated at 200° C. for 2 minutes, thereby precipitating a solder.

CONTROL 1

A solder was precipitated following the same procedures as in Example 2, except that a tin powder was not mixed therewith.

The above results are summarized in Table 1.

TABLE 1

|  | Composition | Solder Precipitation State |
| --- | --- | --- |
| Example 1 | Lead salt of rosinic acid + tin powder | ⊚ |
| Example 2 | Tin-lead salt of rosinic acid + tin powder | o |
| Control 1 | Tin-lead salt of rosinic acid | Δ |

⊚ : a large precipitation amount with good solderability for the pattern
o: a relatively large precipitation amount with good solderability for the pattern
Δ: a small precipitation amount The tin powder used in Examples 1 and 2 was an Sn-S-200 (segment-like powder) available from Fukuda Metal Film Powder K.K. However, when an Sn-At-250 (needle-like powder) or an Sn-At-W-250 (irregular powder) also available from Fukuda Metal Film Powder K.K. was used, the same results as in the examples were obtained.

Figure 2:
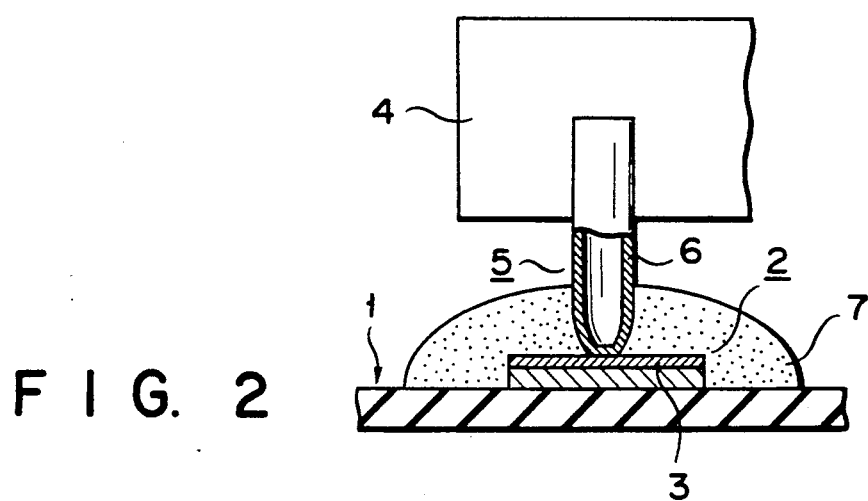
Figure 3:
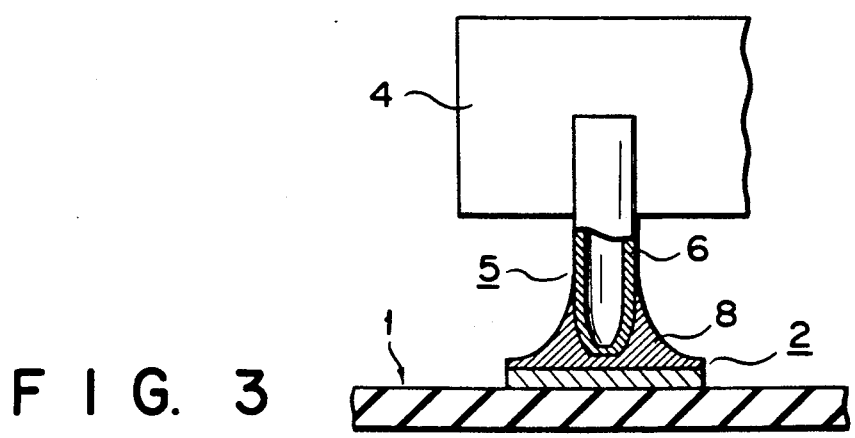

When the method of precipitating the solder according to the present invention is applied to, e.g., the soldering of electronic components, lead portion 5 with tin plating 6 of electronic component 4 is brought into contact with pad portion 2 with tin plating 3, which is located on printed circuit board 1, as shown in FIG. 1. Composition 7 obtained by mixing a tin powder into a lead salt of rosinic acid is applied to the contact portion, as shown in FIG. 2. The portion of interest is heated to precipitate solder 8 as a fillet, as shown in FIG. 3, thereby soldering pad portion 2 with lead portion 5.

The application of a paste-like solder precipitating composition to solder precipitation will be described below.

A lead carboxylate, a solvent, a gelling agent (a viscosity stabilizer) were charged in a mixer having an internal volume of 4 l, and the mixture was heated to 180° C. The mixture was then stirred for 30 minutes, thus dissolving the ingredients. After 30 minutes, the mixture was naturally cooled to 30° C., a tin powder was added thereto, and then the resultant mixture was kneaded for 30 minutes. The paste-like solder precipitating compositions of Examples 11 to 18 (E11 to E18) shown in Table 2 were prepared according to this method.

Lead naphthenate has a liquid phase at room temperature, and a solvent was not added thereto.

TABLE 2

|  |  |  | E11 | E12 | E13 | E14 | E15 | E16 | E17 | E18 |
| --- | --- | --- | --- | --- | --- | --- | --- | --- | --- | --- |
| Lead Carboxylates | Lead Acetate | (Pb 54%) | 25 |  |  |  |  |  |  |  |
|  | Lead Naphthenate | (Pb 24%) |  | 55 |  |  | 48 |  | 59 |  |
|  | Lead Rosinate | (Pb 15%) |  |  | 60 |  |  | 30 |  |  |
|  | Polymerized Lead Rosinate | (Pb 10%) |  |  |  | 63 |  |  |  | 40 |
| Solvent | Butyl Carbitol |  | 24 | 18 |  |  |  | 9 |  |  |
|  | Squalene |  |  |  |  | 21 |  |  |  | 26 |
| Viscosity Stabilizer | Castor Wax |  | 2 | 1 | 2 | 1 | 2 | 1 | 2 | 2 |
|  | Gum Rosin |  | 19 | 14 |  |  | 12 |  | 15 | 25 |
|  | Tin Powder |  | 30 | 30 | 20 | 15 | 38 | 60 | 24 | 7 |

(Unit: wt %)

These compositions were tested for their printing properties, solderabilities for fine patterns, soldering properties, and cleaning properties, in the following manner. A commercially available solder cream, as control 11 (C11) was also tested in the same manner.

(1) Printing Property

The above compositions were continuously printed using a standard screen (a stainless metal mask having a film thickness of 200 μm and a pattern of 0.3 × 10 mm [pitch: 0.65 mm]). These printed compositions were checked to determine whether line disconnections and bridges had occurred therein. The absence of line disconnections and bridges is represented by o, while the presence of line disconnections or bridges is represented by x.

(2) Solderability for Fine Patterns

The paste-like solder precipitating compositions were applied to printed circuit boards each prepared by patterning a giass epoxy board with a copper film at the same pitch as the 0.15-mm pitch TAB (Tape Automated Bonding) carrier tape outer lead and plating the resultant pattern with tin. Thus, TAB components were temporarily fixed on the boards. After the boards were heated on a 220° C. hot plate for 10 minutes, they were then immersed and cleaned in chlorothen for 90 minutes, thereby obtaining the evaluation boards. These boards were observed with a microscope at a magnification of 100X to check for bridges between the 0.15-mm pitch TAB outer leads. The absence of bridges is represented by ○, and the presence of bridges is represented by x.

(3) Soldering Property

All TAB outer lead pins (300 pins) of each evaluation board were checked to determine whether they were soldered to the printed circuit board. A sample having all the pins soldered to the board is represented by ○, and a sample having some pins which are not soldered to the boards is represented by x.

(4) Cleaning Property

The evaluation boards were also, to determine the presence or absence of a residue thereon. The absence of a residue is represented by ○, and the presence of a residue is slightly represented by Δ.

These evaluation results and the compositions of the precipitated solder alloys are summarized in Table 3.

TABLE 3

|  |  | E11 | E12 | E13 | E14 | E15 | E16 | E17 | E18 | C11 |
|---|---|---|---|---|---|---|---|---|---|---|
| Printing Property | | ○ | ○ | ○ | ○ | ○ | ○ | ○ | ○ | ○ |
| Solderability for Fine Pattern | | ○ | ○ | ○ | ○ | ○ | ○ | ○ | ○ | x |
| Soldering Strength | | ○ | ○ | ○ | ○ | ○ | ○ | ○ | ○ | ○ |
| Cleaning Property | | ○ | ○ | ○ | ○ | ○ | ○ | ○ | ○ | Δ |
| Precipitated Solder Alloy Composition (wt %) | Sn/Pb | 62/38 | 63/37 | 62/38 | 64/36 | 73/27 | 86/14 | 53/47 | 54/46 | 63/37 |

According to the test results, the solder precipitating compositions of the present invention were found to have an excellent solderability for fine patterns and better cleaning properties as compared with the conventional solder cream (control 11).

The degree of sag of each paste-like solder precipitating composition of the present invention upon printing and heating to high temperatures was examined. In order to eliminate sagging of the solder precipitating composition at high temperatures, the mixing of a powder such as an alumina, silica gel, or white carbon powder in each composition was taken into consideration. However, the mixing of cellulose in each composition was found to be more effective. For example, the solder precipitating composition consisting of 48.5 wt% of lead naphthenate (Pb 24%), 1.2 wt% of castor wax, 12.1 wt% of gum rosin, 11.5 wt% of cellulose, and 26.7 wt% of tin powder had a viscosity of 120 million cps at 25° C. No sagging occurred with this composition, even when it was heated to 220° C.

According to the present invention, as has been described above, a solder precipitating composition which has an excellent solderability for fine patterns can be obtained. Since the above solder composition allows electronic components having very small lead pitches to be surface-mounted on a printed circuit board, the present invention contributes to the high integration density and compactness of the electronic equipment.

What is claimed is:

1. A solder precipitating composition for precipitating a solder alloy comprising at least two metals, said alloy for achieving an electrical connection of parts, comprising:
    a powder of a first metal, said first metal having the highest ionization level among the metals constituting the solder alloy; and
    a carboxylate of a second metal,
    wherein the solder alloy is precipitated as a result of a substitution reaction between the first metal and metal ions in the carboxylate.

2. The composition according to claim 1, further comprising a solvent and a viscosity stabilizer which are mixed with said metal powder and said metal carboxylate to prepare a paste.

3. The composition according to claim 1, further comprising a viscosity stabilizer, and wherein said metal carboxylate has a liquid phase, and said metal powder, said metal carboxylate, and said viscosity stabilizer are mixed to prepare a paste.

4. The composition according to claim 1, wherein a ratio of a weight Wp of a metal P in the form of said metal powder to a weight Ws of a metal S in the form of said metal carboxylate is represented by the following equation:

$$Wp/Ws < Ap/As + Mp/Ms$$

where,
As is parts by weight of metal S of said solder alloy,
Ap is parts by weight of metal P of said solder alloy,
Ms is the atomic weight of metal S, and
Mp is the atomic weight of metal P.

5. The composition according to claim 1, further comprising a sag preventing agent.

6. The composition according to claim 5, wherein the sag preventing agent contains cellulose.

7. The composition according to claim 2, wherein said viscosity stabilizer is selected from the group consisting of rosin, castor wax and mixtures thereof.

8. The composition according to claim 3, wherein said viscosity stabilizer is selected from the group consisting of rosin, castor wax and mixtures thereof.

9. The solder precipitating composition according to claim 1, consisting essentially of 48.5 weight % of lead naphthenate having 24 weight % lead, 26.7 weight % of tin, 1.2 weight % of castor wax, 12.1 weight % of gum rosin and 11.5 weight % of cellulose.

10. The solder precipitating composition according to claim 1, consisting essentially of 7 to 60 weight % of a tin powder, 25 to 63 weight % of a lead carboxylate, wherein 10 weight % to 54 weight % of said lead carboxylate is lead, 0 to 26 weight % of a solvent and 1 to 27 weight % of a viscosity stabilizer.

11. The composition according to claim 10, wherein the lead carboxylate is selected from the group consisting of lead acetate, lead naphthenate, lead rosinate and polymerized lead rosinate.

12. The composition according to claim 11, wherein the solvent is selected from the group consisting of butyl carbitol and squalene; and wherein the viscosity stabilizer is selected from the group consisting of custer wax, gum rosin and a mixture of custer was and gum rosin.

13. The composition according to claim 12, wherein the composition consists essentially of
   30 weight % tin powder,
   25% weight % lead acetate having 54 weight % lead,
   24 weight % butyl carbitol,
   2 weight % castor wax and
   19 weight % gum rosin.

14. The composition according to claim 12, wherein the composition consists essentially of
   30 weight % tin powder,
   55 weight % lead naphthenate having 24 weight % lead,
   1 weight % castor wax and
   14 weight % gum rosin.

15. The composition according to claim 12, wherein the composition consists essentially of
   20 weight % tin powder,
   60 weight % lead rosinate having 15 weight % lead,
   18 weight % butyl carbitol and
   2 weight % castor wax.

16. The composition according to claim 12, wherein the composition consists essentially of
   15 weight % tin powder,
   63 weight % polymerized lead rosinate having 10 weight % lead,
   21 weight % squalene and
   1 weight % castor wax.

17. The composition according to claim 12, wherein the composition consists essentially of
   38 weight % tin powder,
   48 weight % lead naphthenate having 24 weight % lead,
   2 weight % castor was and
   12 weight % gum rosin.

18. The composition according to claim 12, wherein the composition consists essentially of
   60 weight % tin powder,
   30 weight % lead rosinate having 15 weight % lead,
   9 weight % butyl carbitol and
   1 weight % castor wax.

19. The composition according to claim 12, wherein the composition consists essentially of
   24 weight % tin powder,
   59 weight % lead naphthenate having 24 weight % lead,
   2 weight % castor wax and
   15 weight % gum rosin.

20. The composition according to claim 12, wherein the composition consists essentially of
   7 weight % tin powder,
   40 weight % polymerized lead rosinate having 10 weight % lead,
   26 weight % squalene,
   2 weight % castor wax and
   25 weight % gum rosin.

21. A solder precipitating composition for precipitating a solder alloy comprising at least two metals, said alloy for achieving an electrical connection of parts, comprising:
   a powder of a metal which is not contained in said solder alloy and having an ionization level higher than that of any of the metals constituting said solder alloy; and
   carboxylates of the metals constituting the solder alloy;
   wherein the solder alloy comprising the metals contained in said carboxylates is precipitated as a result of a substitution reaction between the powdery metal and metal ions in the carboxylates.

22. A solder precipitating composition for precipitating a Sn-Pb solder alloy for achieving an electrical connection of parts, comprising:
   a tin powder; and
   a lead carboxylate;
   wherein the Sn-Pb solder alloy is precipitated as a result of a substitution reaction between the tin powder and the lead ion of the lead carboxylate.

23. The composition according to claim 22, wherein the ratio of the weight of Sn powder to the weight of Pb in the lead carboxylate ranges from 16.9 : 10 to 133.3 : 10.

24. The composition according to claim 22, wherein the ratio of the weight of Sn powder to the weight of Pb in the lead carboxylate ranges from 16.9 : 10 to 33.3 : 10.

25. The composition according to claim 22, wherein the ratio of the weight of Sn powder to the weight of Pb in the lead carboxylate ranges from 17.5 : 10 to 23.8 : 10.

26. The composition according to claim 22, wherein the ratio of the weight of Sn powder to the weight of Pb in the lead carboxylate is substantially 22 : 10.

27. The composition according to claim 22, wherein said lead carboxylate is at least one lead carboxylate selected from the group consisting of a lead rosinate, lead naphthenate, lead stearate, lead acetate and lead oleate.

28. The composition according to claim 21, wherein said metal powder is selected from the group consisting of Zn powder and In powder, and said metal carboxylates comprise a mixture of lead carboxylate and tin carboxylate.

* * * * *